United States Patent [19]
Tetzlaff et al.

[11] Patent Number: 5,909,188
[45] Date of Patent: Jun. 1, 1999

[54] PROCESS CONTROL TRANSMITTER WITH ADAPTIVE ANALOG-TO-DIGITAL CONVERTER

[75] Inventors: David E. Tetzlaff, Minnetonka; James P. Ross, Lakeville, both of Minn.

[73] Assignee: Rosemont Inc., Eden Prairie, Minn.

[21] Appl. No.: 08/805,128

[22] Filed: Feb. 24, 1997

[51] Int. Cl.⁶ ................................................ H03M 1/12
[52] U.S. Cl. ................................. 341/155; 341/165
[58] Field of Search ............................ 341/155, 165, 341/166

[56] References Cited

U.S. PATENT DOCUMENTS

| | | | |
|---|---|---|---|
| 4,198,677 | 4/1980 | Brunner et al. | 364/571 |
| 4,616,349 | 10/1986 | Shirley | 367/66 |
| 4,851,841 | 7/1989 | Sooch | 341/143 |
| 4,866,435 | 9/1989 | Frick | 340/870.16 |
| 5,010,347 | 4/1991 | Yukawa | 341/143 |
| 5,095,495 | 3/1992 | Golden | 375/14 |
| 5,101,200 | 3/1992 | Swett | 340/937 |
| 5,157,395 | 10/1992 | Del Signore et al. | 341/143 |
| 5,339,335 | 8/1994 | Molnar | 375/103 |
| 5,410,310 | 4/1995 | Molnar | 341/143 |
| 5,457,714 | 10/1995 | Engel et al. | 375/247 |

FOREIGN PATENT DOCUMENTS

| | | |
|---|---|---|
| 0 405 726 A2 | 1/1991 | European Pat. Off. . |
| 0 466 229 A1 | 1/1992 | European Pat. Off. . |

*Primary Examiner*—Brian Young
*Assistant Examiner*—Peguy JeanPierre
*Attorney, Agent, or Firm*—Westman, Champlin & Kelly, P.A.

[57] ABSTRACT

A transmitter for use in a process control setting includes a sensor adapted to couple to a process and provide a sensor output related to a parameter of the process. A modulator coupled to the sensor output responsively provides a digital bit stream output representative of the sensor output. A filter provides a current decimation output. A comparator compares a previous decimation output with the current decimation output. Circuitry is provided for transmitting an output related to the parameter based upon the current decimation.

27 Claims, 8 Drawing Sheets

PROCESS CONTROL TRANSMITTER WITH ADAPTIVE ANALOG-TO-DIGITAL CONVERTER

BACKGROUND OF THE INVENTION

The present invention relates to transmitters of the type used in the process control industry. More specifically, the present invention relates to a transmitter having an analog-to-digital converter with adaptive resolution, update rate or resolution and update rate.

Transmitters in the process control industry typically communicate with a controller over the same two wires over which they receive power. A transmitter receives commands from a controller and sends output signals representative of a sensed process variable back to the controller. A commonly used method is a current loop where the sensed parameter is represented by a current varying in magnitude between 4 and 20 mA.

A transmitter includes a sensor for sensing a process variable which is controlled by a process. The sensor outputs an analog signal which is representative of one of several variables, depending on the nature of the process to be controlled: pressure, temperature, flow pH, turbidity, gas concentration, etc. Some of the variables to be controlled have a large dynamic range, such as in a flowmeter, where amplitude of the analog signal changes by a factor of 10,000.

An analog-to-digital converter in the transmitter converts the analog sensor signal to a digital representation of the sensed process variable for subsequent analysis in the transmitter or for transmission to a remote location. A microprocessor typically compensates the sensed and digitized sensor signal and an output circuit in the transmitter sends an output representative of the compensated process variable to a remote location.

Frequently, transmitters use a sigma-delta analog-to-digital converter in which the analog sensor output is connected to a high speed sigma-delta modulator. The sigma-delta modulator provides a high speed digital bit stream output representative of the polarity and magnitude of the sensor output. This bit stream is applied to a digital filter such as a decimating filter which generally performs a filtering or integration operation and provides a multi-bit output (i.e., a data byte or a data word) at a slower rate.

Generally, there is a tradeoff between resolution and update rate (or bandwidth) in analog-to-digital converters. The resolution of the analog-to-digital converter is inversely related to the conversion rate (or bandwidth) of the converter.

SUMMARY OF THE INVENTION

The present invention includes a transmitter for use in the process control industry having an adaptive analog-to-digital converter. The transmitter includes a sensor adapted to couple to a process and provide a sensor output related to a process variable. A modulator coupled to the sensor output responsively provides a digital single-bit stream or multi-bit stream output which is a digital representation of the polarity and magnitude of the sensor output. A filter provides a decimated output based upon decimation of the bit stream output. In some embodiments, multiple outputs representing differing decimation rates are provided. Aspects of the invention include adjusting the precision of the decimation, providing multiple outputs from the decimation filter, and selection of decimation precision based upon change in the sensor output. For example, a comparator compares a previous decimation output with a current decimation output and responsively provides the update signal to the filter and output register. In one embodiment, if the current decimation and the previous decimation are substantially the same, an update signal is not generated whereby the current decimation continues, thereby increasing the resolution of the analog-to-digital converter. However, if there is a difference between the current decimation and the previous decimation, an update signal is provided to the filter. In one embodiment, the transmitter includes circuitry providing an output related to the parameter in response to the current decimation. This output may, for example, be transmitted on a two-wire process control loop. Another aspect of the invention includes an analog-to-digital converter having outputs of varying resolution or the ability to change resolution based upon rate of change of the input signal.

DETAILED DESCRIPTION OF THE PREFERRED EMBODIMENTS

Figure 1:
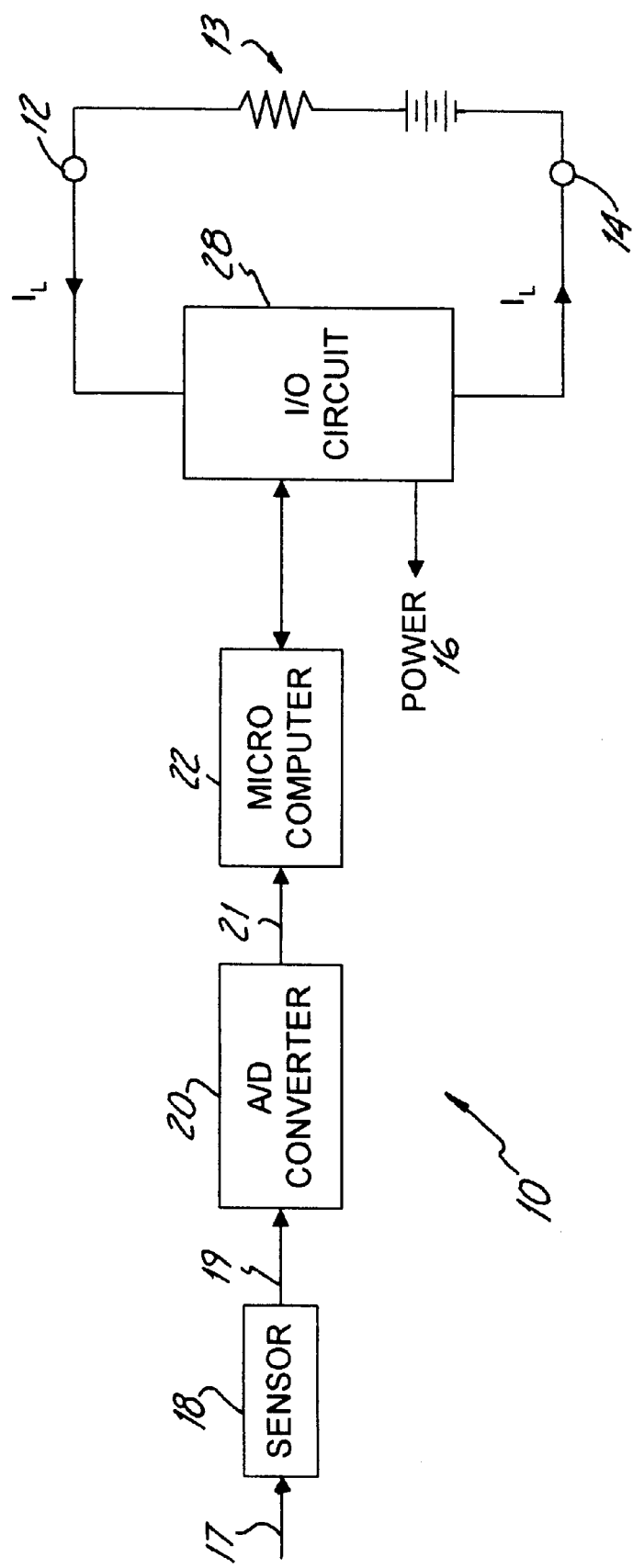
FIG. 1 is a simplified block diagram of a transmitter in accordance with the present invention.

Two-wire transmitter 10 shown in FIG. 1 is a transmitter which provides adaptive resolution and update rate in accordance with the present invention. As shown in FIG. 1, transmitter 10 has a pair of terminals 12 and 14 which are connected to a two-wire 4 to 20 milliampere current loop 13, typically used in industrial process control systems. Loop current $I_L$ flows into the transmitter through terminal 12 and out of the transmitter through terminal 14. All power for the electrical circuitry of transmitter 10 is derived from the loop current. Transmitter 10 includes analog sensor 18, quasi-continuous non-rezeroed integrating A/D converter 20, microcomputer system 22, and input-output (I/O) circuit 28 which includes power supply output 16. I/O circuit 28 communicates over two-wire loop 13 through terminals 12 and 14 with an analog signal (by varying the magnitude of analog loop current $I_L$) and with a digital signal according to the HART® protocol. The DE protocol may also be used to communicate between transmitter 10 and the control system on the loop 13. Alternatively, I/O circuit 28 provides fully digital communication with the controller, as in the Fieldbus protocol.

Sensor 18 senses the process parameter 17 which, for example, may be pressure or temperature. Sensor 18 can be a capacitive pressure sensor which provides analog sensor output 19 which varies as a function of the sensed parameter 17. Frequently, a signal conditioner (not shown) conditions sensor output 19 as desired. Output 19 is coupled to A/D converter 20 which digitizes the analog portion of sensor output 19 and provides a digitized output 21 to microcomputer system 22. I/O circuit 28 couples an output (either digital or analog) representative of the sensed parameter 17 onto loop 13. Analog-to-digital converters typically provide conversions at a fixed update rate with a fixed resolution. There is a known trade off between resolution and update rate of the converter. Specifically, it is known to adjust the update rate to follow rapidly changing input signals or provide better resolution. The present invention provides a new technique for changing the band width (update rate) and resolution of a delta-sigma analog-to-digital (A/D) converter.

Figure 2:
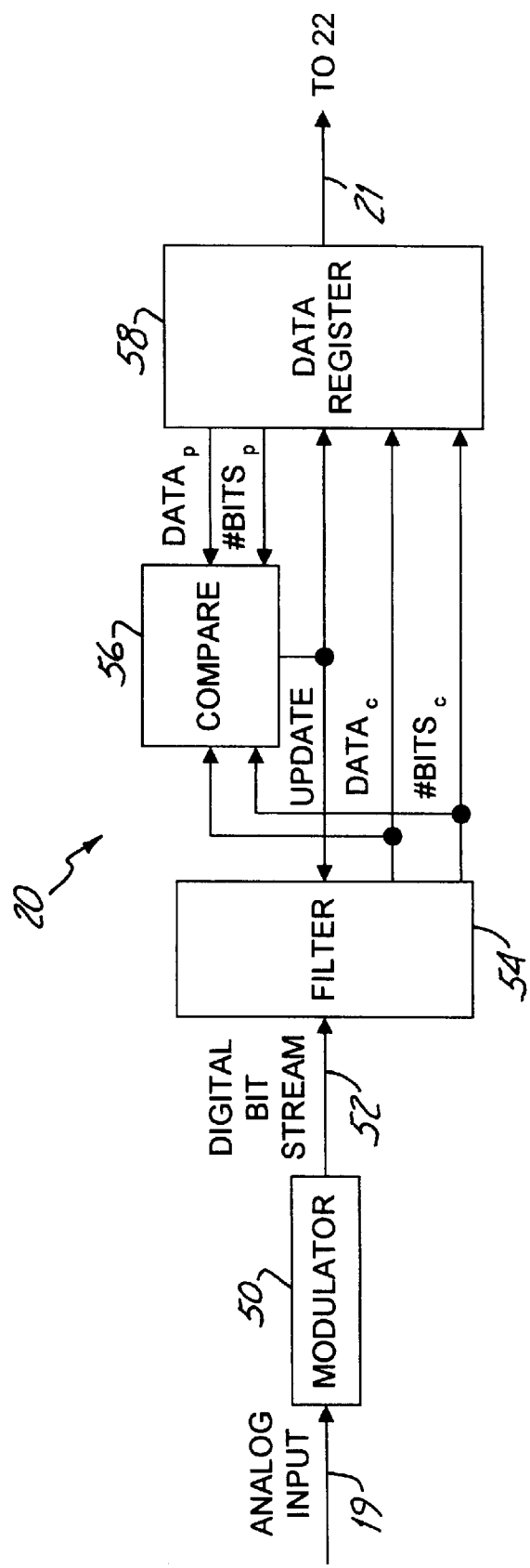
FIG. 2 is a simplified block diagram of an analog-to-digital converter used in the transmitter of FIG. 1 in accordance with the present invention.

FIG. 2 is a simplified block diagram of A/D converter 20 in accordance with one embodiment. Converter 20 includes modulator 50 coupled to sensor 18 which provides bit stream output 52, a high speed stream of 1's and 0's at a fixed clock rate which is representative of input 19. Filter 54 receives stream 52, performs a decimation and provides current decimated output Datac which comprises a byte or series of bytes representing the result of the decimation. Data may be selected as any number of bits and is not limited to bytes. One decimation (or "conversion") may be, for example, an integration of the 1's and 0's in stream 52. The decimation occurs over a period of time and is terminated when filter 54 receives an update signal.

The present invention recognizes that the accuracy and conversion rate of A/D 20 can be controlled by adjusting the decimation period of filter 54. For example, if the decimation period is for only a single bit in stream 52, $Data_C$, has a resolution of only two values (1 or 0), but has a fast update rate. On the other hand, if the decimation period is 256 bits long, the update rate will be 256 times longer but filter 54 can resolve 256 (or more, depending on the order of the modulator) different levels in input 19.

Filter 54 also provides a current number of bits output (#Bits$_C$) representative of the number of bits from stream 52 which were decimated in generating $Data_c$. The value of #Bits$_C$ changes based upon the number of bits received from stream 52 (i.e. the length of the decimation period) which is determined by when filter 54 receives an update signal. Compare circuit 56 provides an update signal (update) to filter 54 and data register 58. Data register 58 stores the previous values of $Data_C$, (as $Data_P$) and #Bits$_C$ (as #Bits$_P$) which are provided to compare function block 56. Data register 58 provides digital output 21 representative of analog input 19.

The invention automatically and dynamically adjusts the update rate/resolution of A/D converter 20 based upon characteristics of input signal 19 by controlling the decimation period of filter 54. Unlike typical prior art update rate/resolution adjustment techniques, the sampling rate of modulator 50 remains constant. Update rate/resolution is adjusted by controlling the period of the decimation (conversion) performed by filter 54, i.e., by adjusting the number of bits in bit stream 52 used by filter 54 in performing the decimation. Sigma-delta converters are described in U.S. Pat. No. 4,851,841 issued Jul. 25, 1989 and U.S. Pat. No. 4,866,435 issued Sep. 12, 1989 and commonly assigned with the present application.

Filter 54 may be any appropriate filter generally referred to as a decimating filter, i.e., a sinc filter, etc. One aspect of the invention includes a filter in a sigma-delta converter with an adjustable conversion rate selected based upon receipt of an update signal.

Another aspect of the invention includes generation of the update signal or otherwise adjusting the precision of the filter. In one embodiment, the update signal is generated by comparator 56 when $Data_c$ is "significantly" different than $Data_P$. Specifically, register 58 stores the previous value of the current data ($Data_C$) as the previous value ($Data_P$) and the previous value of #Bits$_C$, as #Bits$_P$. Comparator 56 receives $Data_P$ #Bits$_P$, $Data_C$, and #Bits$_C$. If the value $Data_C$ is "significantly" different from $Data_P$, comparator 56 generates an update signal. As used herein, what constitutes a "significant" difference may be selected appropriately for the implementation and may change dynamically during operation. For example, the difference may be based upon relative change between the two valves, percentage change, or other comparisons. The threshold for a "significant" difference is selectable and is related to the expected amount of noise present at input 17. The update signal triggers register 58 to store the current values of $Data_C$ and #Bits$_C$ as $Data_P$ and #Bits$_P$, respectively.

If, on the other hand, $Data_C$ is essentially the same (i.e., not significantly different) as the $Data_P$, filter 54 continues decimation of stream 52 which increases the decimation period and thereby increases the accuracy of Datac and the value of #Bits$_C$. Decimation continues until either: (1) $Data_C$ has a greater precision than $Data_P$, based upon a comparison of #Bits$_C$ with #Bits$_P$, or (2) $Data_C$ is "significantly different" than $Data_P$. Thus, the invention allows adaptive selection of the resolution/update rate directly by the A/D 20, and results in higher resolution with minimal additional circuitry and low power consumption, desirable features given the design constraints of process control transmitters.

One embodiment of the present invention can be illustrated with filter 54 implementing a sinc filter. A first order sinc filter accumulates the number of "1's" in stream 52 generated by modulator 50 for a period of time. For this example assume: (1) the fastest update rate is 1/64 of the sampling rate of modulator 50, (2) the minimum resolution of filter 54 is six bits, and (3) the resolution is adaptively increased by factors of two (and therefore the update rate will decrease by factors of 2). These parameters are merely for illustration and do not limit the scope of the invention.

Assume that converter 20 receives a DC signal (i.e. unchanging) on input 17, that #Bits$_C$ is at a minimum (therefore resolution is at the minimum of six bits) and that $Data_P$ is zero. During a first conversion, filter 54 accumulates 64 samples from stream 52 and generates a six bit conversion (i.e. #bits$_C$ 6) at an update rate of 1/64 of the sampling rate of modulator 50 (i.e. the decimation period is 64 times the sampling period) . As Datac is "significantly different" than $Data_P$, an update signal is provided to filter 54 and register 58 whereby data register 58 stores $Data_C$ for use as $Data_P$. The update signal also clears the accumulator in filter 54. During a second conversion, after 64 samples have been received, comparator 56 again compares $Data_C$ with $Data_P$. Since the input 17 is at the same DC level, $Data_C$ and $Data_P$ are substantially the same and have the same resolution (i.e., #Bits$_C$=#Bits$_P$) . Therefore, an update signal is not generated. After another 64 samples have been received by filter 54 (i.e., an increase of a power of 2 over the previous), compare circuit 56 again compares $Data_C$ to $Data_P$. The values are still substantially the same, except for the increased resolution. However, #Bits$_C$ >#Bits$_P$ and therefore, the resolution of $Data_C$ >$Data_P$, so circuit 56 generates an update signal causing register 58 to latch $Data_C$ as output of data register 58 and clear filter 54. Additionally, the comparison can be adjusted to ignore noise in the signal, or even implemented with hysteresis.

During a third conversion with input 17 still at a constant DC level, compare circuit 56 differences $|Data_C-Data_P|$ after 64 and 128 samples. An update signal is not provided because the $Data_C=Data_P$ and $\#Bits_C \leq \#Bits_P$. However, after 256 samples have been converted, an update signal is generated by compare function block 56 because $\#Bits_C$ is eight bits while $\#Bits_P$ is only seven bits. This process continues with each new update signal generating another bit of resolution at half the previous conversion rate. When the maximum converter resolution (i.e. $\#Bit_C=9$ in this example) or the minimum noise floor (i.e. the increased resolution is only converting noise) is reached, update signals are generated at a constant rate.

Assume now that input 17 is allowed to change. Comparator 56 calculates $|Data_C-Data_P|$. In one embodiment, comparison occurs when the number of samples is a power of two. An update signal is generated when $Data_C$ is significantly different than $Data_P$. For example, this may be if Datac is not exactly the same as $Data_P$ or, in another embodiment, if they are more than a few bits different. This causes the resolution/update rate (i.e. $Bits_C$) to be set to a new lower value.

Figure 3:
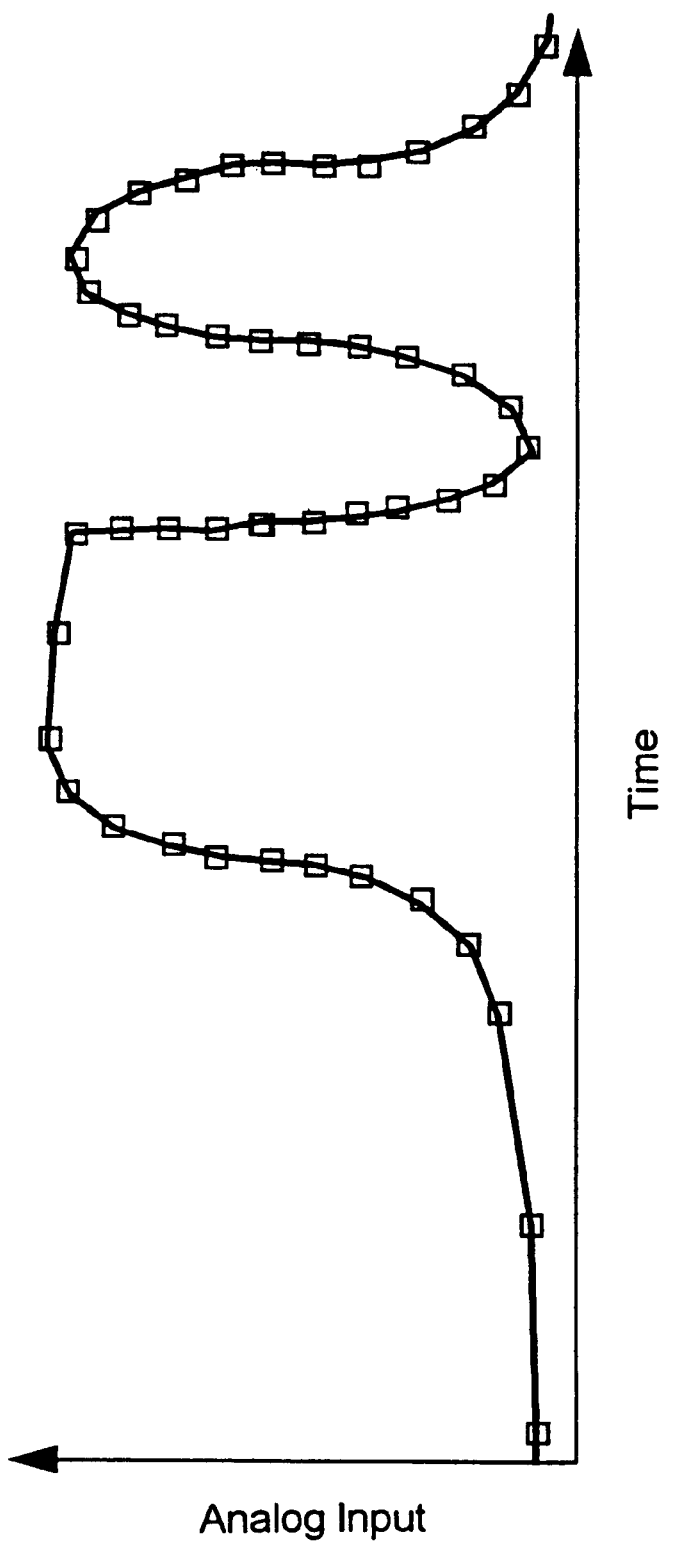
FIG. 3 is a graph of an analog input versus time which shows a variation in a conversion rate.

FIG. 3 is a graph showing analog input signal 17 shown as a line, and also outputs of data register 58, each represented by a square symbol, each occurring at an update signal versus time. As illustrated in FIG. 3 and in accordance with the present invention, during periods when input signal 17 is relatively constant, the time between updates is relatively large. However, when there are large changes in input signal 17, the rate of updates increases such than A/D 20 can more quickly follow the input signal.

Since noise is inherently associated with analog systems, in one embodiment compare circuit 56 ignores differences of one or more bits, as these differences may be due to noise. The determination of the number of bits in the compare function may be explicit or implicit. An explicit determination is a set number. An implicit determination is one which is based upon an examination of the filter output.

Figure 4:
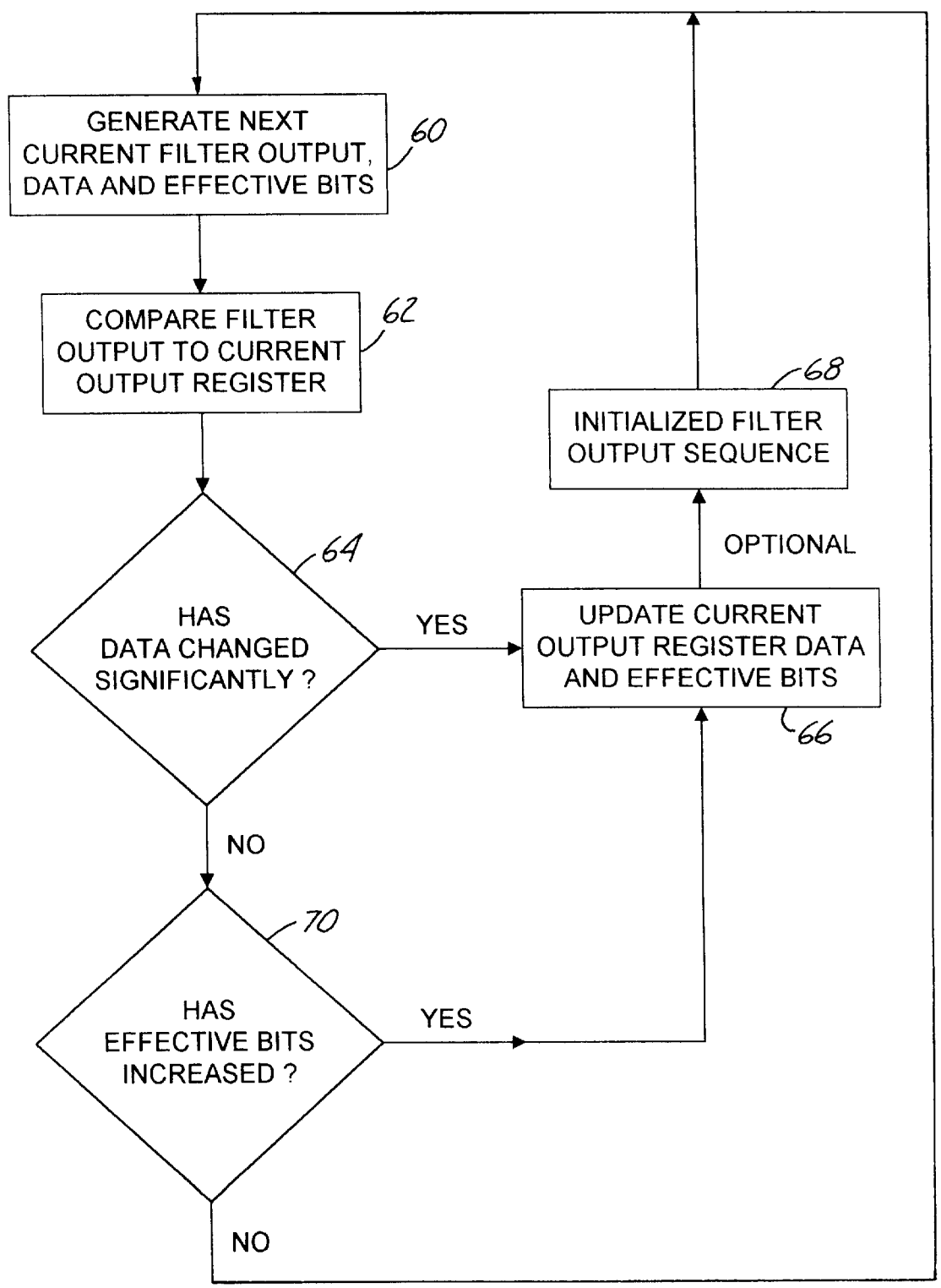
FIG. 4 is a flow chart showing steps in accordance with the invention.

FIG. 4 is a simplified flow chart showing one update algorithm used to adjust the precision of the decimation in accordance with the invention. At block 60, filter 54 generates a current filter output $Data_C$ and $\#Bits_C$. At block 62, compare function block 56 compares $Data_C$ to $Data_P$ stored in register 58. At block 64, if $Data_C$ has changed significantly, control is passed to block 66. At block 66, an update signal is provided by comparator 56 and the filter output sequence may be optionally initialized at filter block 68. Alternatively, if $Data_C$ has not significantly changed, control is passed to block 70 which determines whether $\#Bits_C$ is greater than $\#Bits_P$. If $\#Bits_C$ has increased, control is passed to block 66 and an update signal is provided. However, if $\#Bits_C$ is not greater than $\#Bits_P$, control returns to block 60 and the sequence is repeated.

Figure 5:
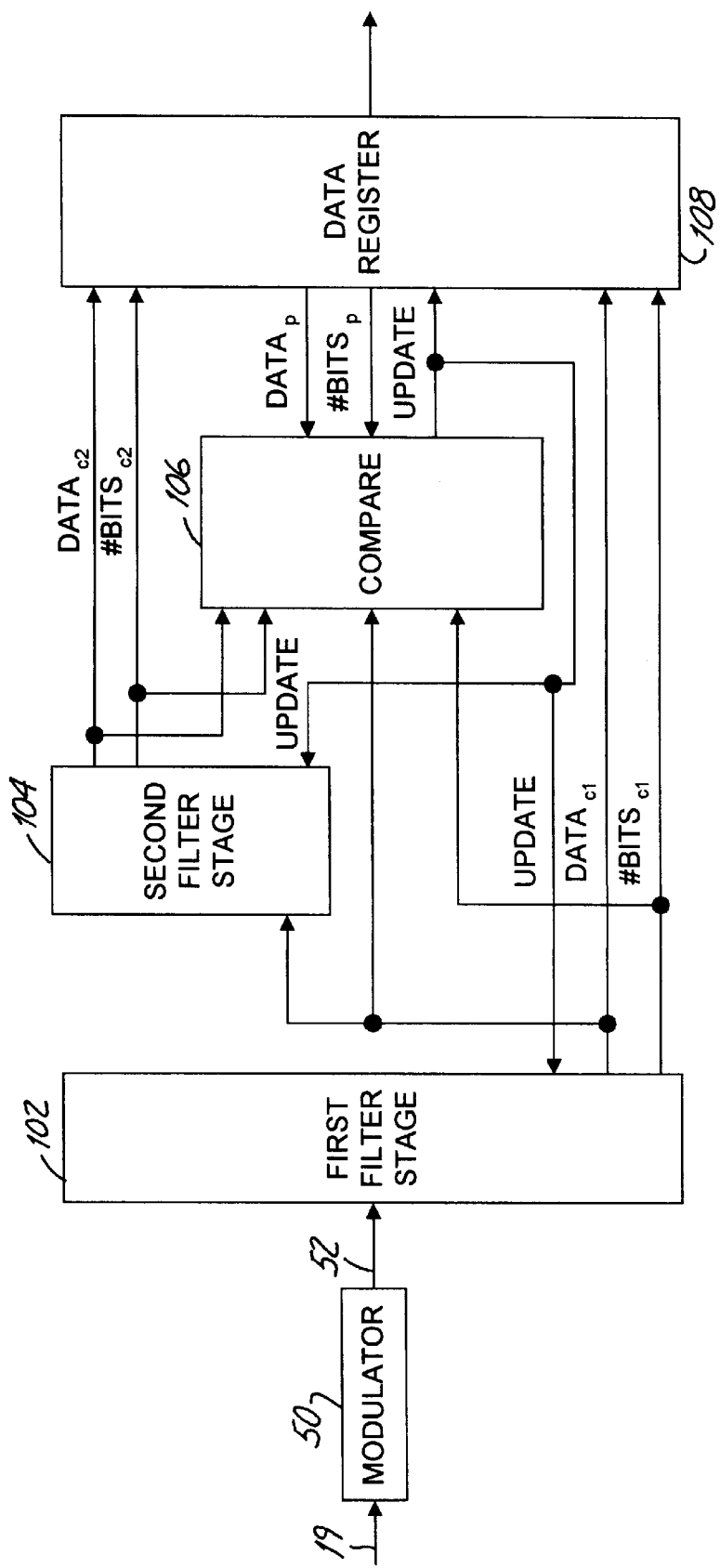
FIG. 5 is a block diagram of an analog-to-digital converter in accordance with another embodiment.

FIG. 5 is a simplified block diagram of an A/D converter 100 in accordance with another embodiment. Converter 100 includes modulator 50 which provides bit stream output 52 to first filter stage 102. Converter 100 also includes second filter stage 104, compare function block 106 and data register 108. First filter stage 102 provides first filter stage data $Data_{C1}$ to second filter stage 104, compare function block 106 and data register 108. Filter stage 102 also provides $\#Bits_{C1}$ to compare function block 106 and data register 108 which is representative of the number of bits in the current conversion ($Data_{C1}$). Second filter stage 104 provides second filter stage data $Data_{C2}$ and $\#Bits_{C2}(_{C2}$ to compare function block 106 and data register 108. Compare function block 106 also receives $Data_P$ and $\#Bits_P$ from data register 108 as in the previous embodiment. Compare function block 106 provides an update signal to first filter stage 102, second filter stage 104 and data register 108.

In the embodiment of FIG. 5, A/D converter 100 is specifically adapted for digital conversion of a signal having large step changes. In contrast, in the embodiment of FIG. 2 the logic is such that if a large step input occurs when $Data_P$ is 16 bits long (65,536 samples) and filter 54 has received more than fifteen bits of samples (32,768), filter 54 may not generate an update for up to another 32,768 samples. However, in the embodiment of FIG. 5, a multi-stage filter and compare circuit reduces this delay. First filter stage 104 may have a fixed update rate, for example, 1/64 of the sampling rate of modulator 50. Second filter stage 104 operates in a manner similar to that described for filter stage 54 in FIG. 2. However, upon receipt of a large step input, compare function 106 immediately outputs an update signal and $Data_{C1}$ is latched by register 108 whereby output 21 rapidly changes to follow the step input. Additionally, in one embodiment the update rate of the first filter stage 102 is also allowed to change in a manner selected to optimally follow the input signal at 17 during large step changes.

Those skilled in the art will recognize that the present invention can be easily expanded to other types of implementations. For example, one aspect of the invention is to use a single filter stage, but have the filter generate outputs at various rates and resolutions. Many filters for delta-sigma converters have a high speed section followed by a low speed section. Such a filter includes an integrator section followed by a differentiator section. The integrator operates at the same rate as the modulator data rate and the differentiator operates at the output data rate.

Figure 6:
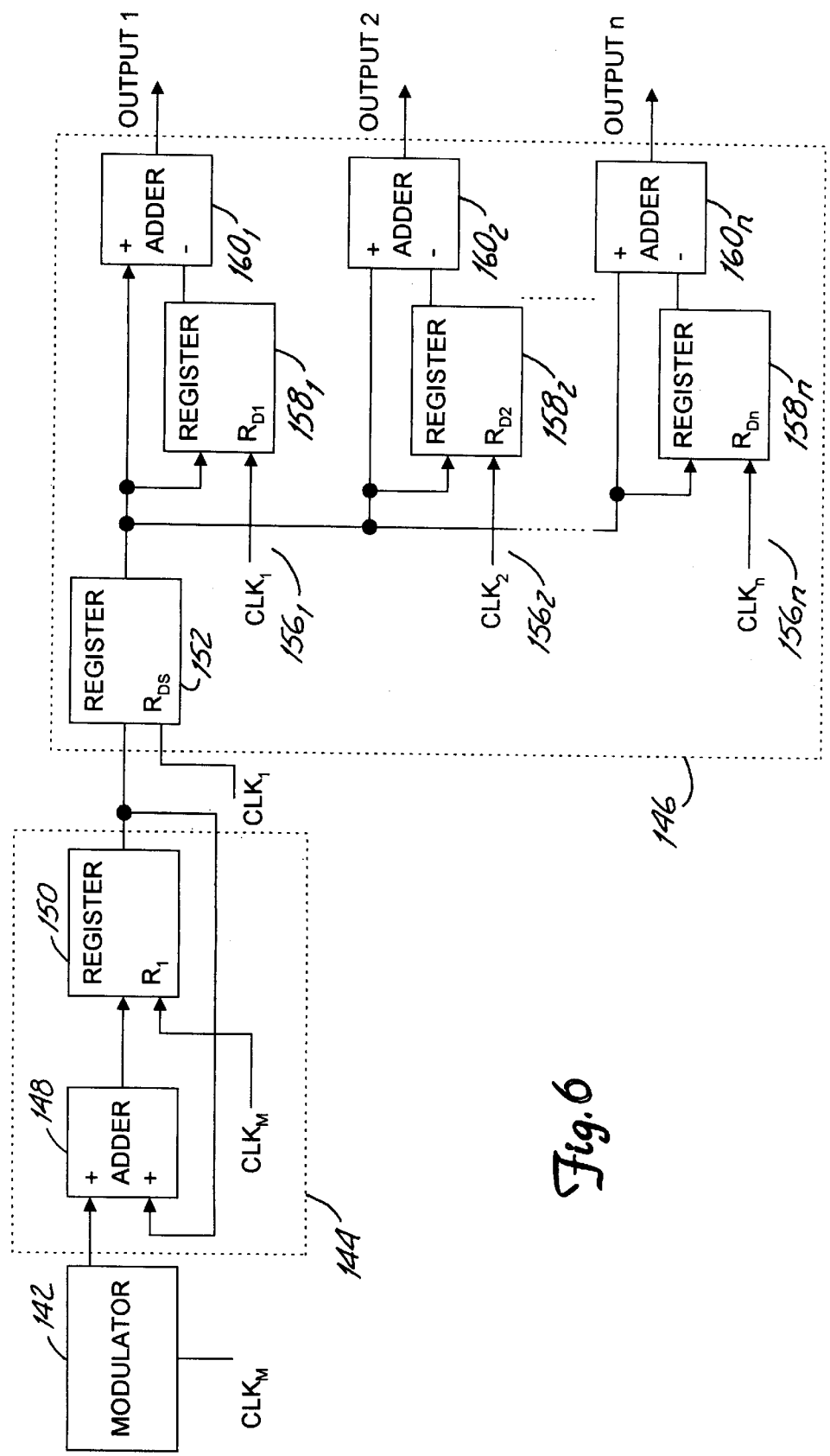
FIG. 6 is a block diagram of a filter in accordance with one embodiment of the invention including more than one differentiator.

Multiple outputs from a decimating filter can be generated by providing a number of different differentiator stages as shown in FIG. 6. FIG. 6 is a simplified block diagram of a decimating filter 140 in accordance with one embodiment. Decimating filter 140 connects to modulator 142. Filter 140 includes an integrator 144 and a multi-output differentiator 146. Adder 148 in integrator 144 connects to modulator 142 and provides an output to integrator register $R_I$150. Register 150 provides an output which is fed back to adder 148 and fed forward to a down sampling register $R_{DS}$ 152 and is clocked at the clock rate of modulator 142, $CLK_M$. Register 152 is clocked at a down-sample clock rate $CLK_1$ which is the fastest conversion rate (and therefore corresponds to the lowest resolution). Differentiator 146 includes N differentiators $156_1$, $156_2$, . . . , $156_N$. Each stage includes a differentiator register $158_1$, . . . $158_N$, which are clocked at clock rates $CLK_1$, . . . $CLK_N$, having outputs connected to the inverting inputs of adders $160_1$, . . . $160_N$, respectively. Non-inverting inputs of adders $160_1$ through $160_N$ connect directly to the output from register 152. Each differentiator $156_1$ . . . $156_N$ provides an output$_1$ . . . . . , output$_N$, respectively. In a preferred embodiment, each of the clock signals $CLK_1$ . . . $CLK_N$ is at a different rate whereby they provide differing levels of resolution for outputs 1–N. The structure and algorithm of FIG. 4 can be easily modified such that the desired resolution from multi-output differentiator 146 is selectable. Filter 146 of FIG. 6 can be used as filter 54 in FIG. 2 in which case the update algorithm of FIG. 4 is performed for each of the N outputs.

Figure 7:
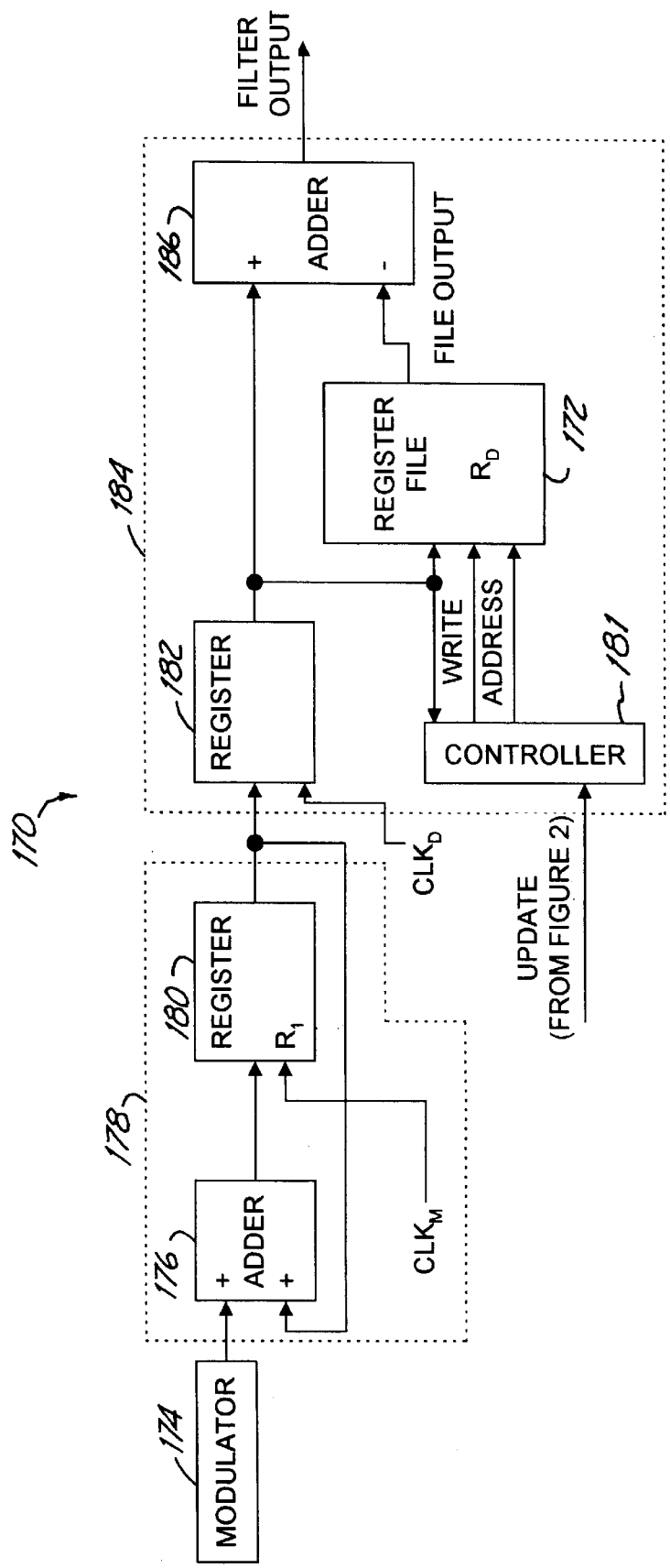
FIG. 7 is a simplified block diagram of a filter in accordance with the invention which uses a register file to maintain data for different decimation rates.

FIG. 7 shows another example of generating multiple filter outputs having various resolution in accordance with the invention. Sinc filter 170 uses a register file 172 to store conversion data (i.e. corresponding to output of FIG. 6) for each of the different decimation rates. Filter 170 connects to modulator 174 through adder 176. The output of adder 176 connects to integrator register $R_I$ 180 which is connected to the input of adder 176 and is clocked at a clock rate $CLK_M$ which is the same as the clock rate of the modulator 174. Register 180 provides an output to register 182 of differentiator 184 which is clocked at a clock rate $CLK_D$. $CLK_D$ is a slower clock rate than $CLK_M$. The output of register 182 is provided to register file 172 and adder 186 which provides a filter output. Register file 172 also receives write and address information from controller 181 which determines timing for and location for address data in file 172, address data from register 182 is read or written. Register 172 contains a number of different data locations, each of which is used to store information from register 182 which was converted using different conversion (i.e. clock) at a different decimation rate. At times $t_{N \cdot M}$, the differentiator stage 184 outputs the result for a decimation by M, wherein N is an integer. At times $t_{N \cdot 2M+1}$, the differentiator stage outputs the result for a decimation by 2M. At times $t_{N \cdot 4M+2}$, the differentiator stage 184 outputs the result for a decimation by 4M. This can be generalized so that the time at which the update is provided is at:

$$N \cdot D + (\log_2(D) - \log_2(M)) \qquad \text{Eq. 1}$$

Equation 1 is valid for a decimation rate of D, where D is a power of 2. Further, N is an integer and M is the minimum decimation rate.

Figure 8:
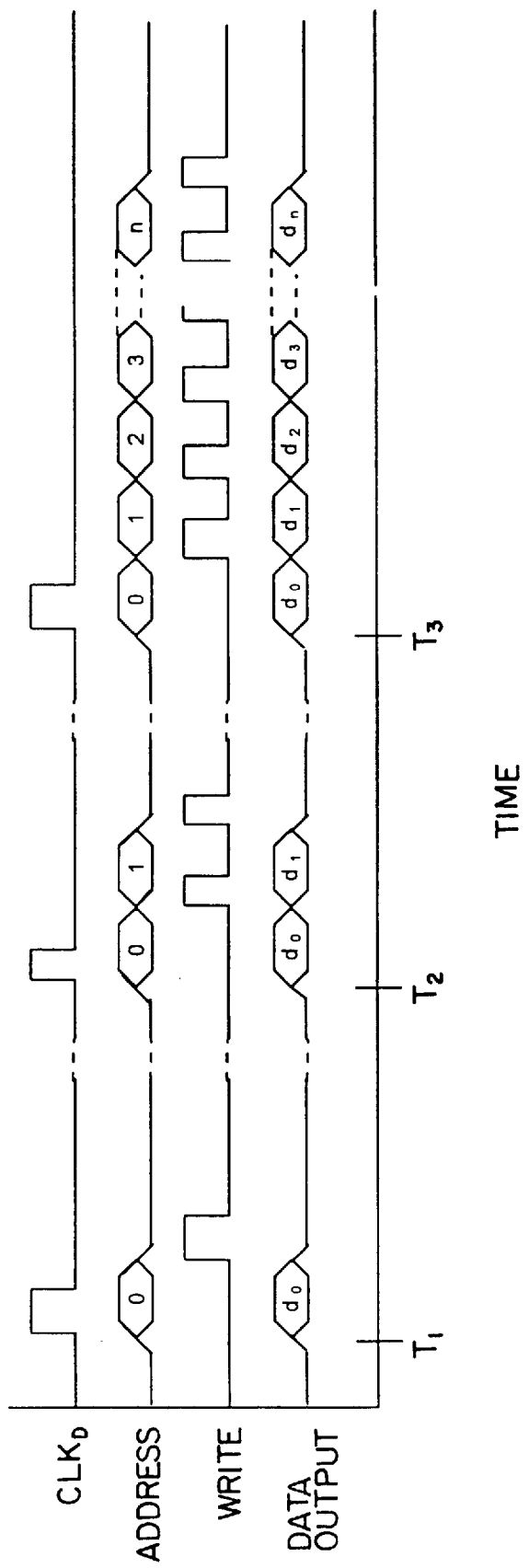
FIG. 8 is a timing diagram for the circuitry of FIG. 7.

FIG. 8 is a timing diagram showing operation of the circuitry of FIG. 7 for a constant DC signal at 17. FIG. 8 is a graph of $CLK_D$, address, write and data output $Data_C$ signals versus time. At time $T_1$, only data for the fastest decimation rate is generated and stored in register file 172 as $d_0$. The address line selects the first entry in the register file 172 (address 0) which is provided on the data output as $d_0$. Adder 186 then provides an output for a differentiator output based upon the minimum number of samples (not shown). In addition to outputting $d_0$, the write line to register 172 causes register file 172 to store the current output from register 182 to address 0. At time $T_2$, outputs $d_0$ and $d_1$, are generated sequentially, and the contents of address 0 and 1 in register file 172 are updated with the current output from register 182. Adder 186 provides two outputs, one for a differentiator output over a period defined by $T_1$, and one for period defined by $T_2$, i.e. two different decimation rates. This continues until time $T_N$ in FIG. 8 at which time all outputs $d_0$ through $d_n$, are generated and all of the registers in register file 172 are updated with the current output from register 182. Thus, the register file contains conversion data for each of the conversion rates which change, in this example, as a power of 2. Those skilled in the art will recognize that other patterns are possible such as decimation rates which are not related as powers of 2 or different ordering of the outputs from register file 172.

The filter of FIG. 7 may be used with the decimation selection technique of the invention. For example, filter 184 of FIG. 7 can replace filter 54 of FIG. 2. In this embodiment, the steps of FIG. 4 are performed on each of multiple outputs from adder 186. In one preferred embodiment, data output from register file 172 is arranged with the longest sampling period (i.e., the greatest resolution) as the first output followed by decreasingly shorter sampling periods (and correspondingly lower precision).

The term selection signal as used in this description is intended to include any set of signals used to adjust the characteristics of the filter. The term decimating filter as used in this description includes any type of multiple stage filter where some of the stages may not decimate the data (i.e. output rate is equal to or greater than the input rate). As used herein, varying the decimation rate has been the technique referenced to vary the resolution. Those skilled in the art will realize there are other techniques that limit the bandwidth of the filter and therefore provide increased resolution. These techniques include changing the coefficients of a digital filter to reduce its bandwidth. This technique of selecting an optimum resolution and bandwidth with other filter types by varying the filter bandwidth or by selecting one of several outputs with different resolutions and bandwidths is considered within the scope of this invention.

The various embodiments are provided for illustration purposes of preferred embodiments. For example, the present invention can be used with any type of decimating filter. Further, the update signal (or any type of selection signal) can be generated based upon any type of calculation or in response to any event appropriate for a specific implementation. The update function can be a dynamic function which changes during operation of the converter. Further, although the modulator has been described generally as operating at a constant sampling rate, it is within the scope of the present invention to allow a variable sampling rate. The invention is suited for applications which have a low bandwidth during some periods followed by large bandwidth requirements during other periods. Further, the conversion rate may be slowed when speed is not required thereby reducing power requirements. This is particularly useful on process control transmitters which must operate within strict power limitations. The sigma-delta converter provides high resolution using relatively few components and low power. As used herein, a "significant" change between a current conversion and a previous conversion is selected to be whatever is significant for the particular application including single bit and multi-bit variations, certain patterns, or variations related to events or based upon equations. The change in the update rate/resolution may be of any desired number of bits and is not limited to the examples set forth herein. The update (i.e., selection) signal is not required necessarily to be based upon a specific comparison between number of bits in a previous conversion and a current conversion and this relationship may be modified as appropriate. Any number of previous conversions may be stored in the data register and used in selection of the decimation rate. It is not necessary that the update signal cause the decimation filter to reset and in some embodiments it may be desirable to allow decimation to continue following such a signal. Further, all of the various functions and parameters may be controlled by the microprocessor or from instructions or commands received over the two-wire circuit. It will be understood that the invention is applicable to any type of charge balancing or integrating A/D converter. The output from the modulator may be a single-bit stream or a multi-bit stream and, as used herein, "bit stream" is intended to include both such variations. The invention includes an A/D converter with multiple outputs of differing resolutions and is not limited to use in transmitters. Further, many of the circuit elements may be implemented in either digital or analog circuitry and the invention is not limited to the circuitry shown.

Although the present invention has been described with reference to preferred embodiments, workers skilled in the art will recognize that changes may be made in form and detail without departing from the spirit and scope of the invention. For example, the invention is applicable to any type of device used in a process control environment and any type of sensor including pressure, temperature, flow, level, etc. Further, the A/D conversion technique set forth herein may be employed to generate a digital signal representative of an analog input in applications other than the process control industry.

What is claimed is:

1. A transmitter for use in a process control system, comprising:
   a sensor adapted to couple to a process and provide a sensor output related to a parameter of the process;
   a modulator coupled to the sensor output responsively providing a digital bit stream output representative of the sensor output;
   a filter decimating the bit stream output and providing a plurality of current outputs with differing resolutions or bandwidths; and
   selection circuitry coupled to the filter which automatically selects one of the plurality of current outputs and responsively provides an output representative of the parameter.

2. The transmitter of claim 1 wherein the selection circuitry selects one of the plurality of current outputs based upon a comparison of a current output and a previous output.

3. The transmitter of claim 2 including a data register which stores the plurality of current outputs for use as the previous output.

4. The transmitter of claim 2 wherein a next higher resolution is selected if the comparison indicates that the previous output and the current output are not substantially different.

5. The transmitter of claim 4 wherein the next higher resolution consists of one or more bits of additional resolution.

6. The transmitter of claim 2 wherein the selection circuitry includes a comparator which compares the current and the previous outputs.

7. The transmitter of claim 1 wherein the plurality of current outputs are separated in time.

8. The transmitter of claim 1 wherein the filter performs an integration.

9. The transmitter of claim 1 wherein the filter includes an accumulator.

10. The transmitter of claim 1 wherein the filter decimates the bit stream output at a decimation rate and the filter decimation rate is adjusted based upon the selection.

11. A transmitter for use in a process control system, comprising:
    a sensor adapted to couple to a process and provide a sensor output related to a parameter of the process;
    a modulator coupled to the sensor output responsively providing a digital bit stream output representative of the sensor output;
    a filter decimating the bit stream output and providing a current output related to the parameter at a current resolution or bandwidth related to a selection signal; and
    selection circuitry coupled to the filter which provides the selection signal to automatically select the current resolution or bandwidth as a function of the current output.

12. The transmitter of claim 11 wherein the selection circuitry selects the current resolution or bandwidth based upon a comparison of a current output and a previous output.

13. The transmitter of claim 12 including a data register which stores the current output for use as the previous output.

14. The transmitter of claim 12 wherein a next higher resolution is selected if the comparison of the previous output and the current output are substantially the same.

15. The transmitter of claim 14 wherein the next higher resolution consists of one or more bits of additional resolution.

16. The transmitter of claim 12 wherein the selection circuitry includes a comparator which compares the current output and the previous output.

17. The transmitter of claim 11 wherein the filter performs an integration.

18. The transmitter of claim 11 wherein the filter includes an accumulator.

19. A transmitter for use in a process control system, comprising:
    sensor adapted to couple to a process and provide a sensor output related to a parameter of the process;
    a modulator coupled to the sensor output responsively providing a digital bit stream output representative of the sensor output;
    a filter decimating the bit stream output and providing a plurality of outputs at differing resolutions or bandwidths thereby providing a plurality of automatically selectable resolutions; and
    output circuitry coupled to the filter which provides a transmitter output related to at least one of the plurality of outputs related to the parameter.

20. The transmitter of claim 19 wherein the output circuitry selects one of the plurality of outputs based upon a comparison of a current output and a previous output.

21. The transmitter of claim 19 wherein the filter includes an integrator providing an integrated output of the digital bit stream and a differentiator which stores a plurality of previous integrated outputs and provides the plurality of outputs based upon a difference between the integrated output and the plurality of previous integrated outputs.

22. The transmitter of claim 21 including a register file which stores the plurality of previous integrated outputs.

23. An analog to digital (A/D) converter, comprising:
    a modulator coupled to an A/D input responsively providing a digital bit stream output representative of the A/D input;
    a filter decimating the bit stream output and providing a current output related to the A/D input at a current resolution or bandwidth which is related to a selection signal; and
    selection circuitry coupled to the filter which provides the selection signal to automatically select the current resolution or bandwidth as a function of the current output.

24. An analog to digital (A/D) converter, comprising:
    a modulator coupled to an A/D input responsively providing a digital bit stream output representative of the A/D input;
    a filter decimating the bit stream output and providing a plurality of outputs at differing resolutions or bandwidths thereby providing a plurality of automatically selectable resolutions; and
    output circuitry coupled to the filter which provides an A/D output related to at least one of the plurality of outputs.

25. A method of monitoring a parameter with a transmitter in a process control system, comprising:
    sensing the parameter and providing a sensor output;
    modulating the sensor output and responsively providing a digital bit stream output;
    decimating the bit stream output and providing a plurality of outputs at differing resolutions or bandwidths to thereby provide a plurality of automatically selectable resolutions; and providing a transmitter output related to the parameter based upon at least one of the plurality of outputs.

26. The method of claim 25 including:

comparing a current output and a previous output; and selecting one of the plurality of the outputs based upon the step of comparing.

27. The method of claim 25 including storing the plurality of outputs.

* * * * *